(12) United States Patent
Tsubonoya et al.

(10) Patent No.: US 7,332,803 B2
(45) Date of Patent: Feb. 19, 2008

(54) CIRCUIT DEVICE

(75) Inventors: Makoto Tsubonoya, Gunma (JP);
Katsuhiko Shibusawa, Gunma (JP);
Takashi Kitazawa, Saitama (JP)

(73) Assignees: Sanyo Electric Co., Ltd., Osaka (JP);
Kanto Sanyo Semiconductors Co., Ltd., Gunma (JP)

( * ) Notice: Subject to any disclaimer, the term of this patent is extended or adjusted under 35 U.S.C. 154(b) by 21 days.

(21) Appl. No.: 10/899,220

(22) Filed: Jul. 26, 2004

(65) Prior Publication Data
US 2005/0040512 A1    Feb. 24, 2005

(30) Foreign Application Priority Data
Aug. 20, 2003  (JP)  ............... P. 2003-208094

(51) Int. Cl.
*H01L 23/52*   (2006.01)

(52) U.S. Cl. ............... 257/692; 257/735; 257/E23.032; 257/E23.043; 257/E23.046

(58) Field of Classification Search ............... 438/111, 438/112, 123, 124, 127; 257/666, 676, 665, 257/672, 690, 692, 734, 735, 784, E23.032, 257/E23.043, E23.046
See application file for complete search history.

(56) References Cited

U.S. PATENT DOCUMENTS 6,424,035 B1*  7/2002  Sapp et al. ............... 257/723
6,602,735 B2*  8/2003  Shyu ............... 438/111

\* cited by examiner

*Primary Examiner*—Quoc Hoang
(74) *Attorney, Agent, or Firm*—Fish & Richardson P.C.

(57) ABSTRACT

A circuit device is provided comprising leads and electrical circuitry. The circuit device has a first semiconductor element, a second semiconductor element, first leads electrically connected to the first semiconductor element or the second semiconductor element via fine metal wires and having an end thereof extending outwardly, second leads electrically connected via metal wires to both the first semiconductor element and the second semiconductor element to thus electrically connect the first and second semiconductor elements.

17 Claims, 5 Drawing Sheets

CIRCUIT DEVICE

BACKGROUND OF THE INVENTION

Priority is claimed to Japanese Patent Application Number JP2003-208094 filed on Aug. 20, 2003, the disclosure of which is incorporated herein by reference in its entirety.

1. Field of the Invention

The preferred embodiments of the present invention relate to, among other things, a circuit device having leads extending outwardly as external terminals.

2. Description of the Related Art

The following description sets forth the inventors' knowledge of the related art and problems therein and should not be construed as an admission of knowledge in the prior art.

A conventional circuit device 100 is hereby described with reference to FIG. 5, wherein FIG. 5A is a plan view of the circuit device 100 and FIG. 5B is a cross-sectional view thereof.

In FIGS. 5A and B, a land 102 formed of conductive material is disposed in a central portion of the circuit device 100 and a plurality of leads 101 have one end thereof disposed in the periphery of the land 102. The one end of the plurality of leads 101 is electrically connected to a semiconductor element 104 via fine metal wires 105, whereas the other end of the leads 101 is exposed from a sealing resin 103. The sealing resin 103 has the function of sealing and integrally supporting the semiconductor element 104, the land 102 and the leads 101.

The leads 101 of this circuit device 100 only have the function of electrically extending outwardly electrodes of the semiconductor element 104 and could not form rewiring sections, etc., thus making it impossible to achieve a complex electrical circuitry inside the circuit device using the leads 101.

SUMMARY OF THE INVENTION

The preferred embodiments of the present invention were developed in view of the aforementioned and/or other problems and a main aspect thereof is to provide a semiconductor device having leads and electrical circuitry.

A circuit device according to some preferred embodiments includes: a plurality of semiconductor elements, first leads connected to bonding pads of the semiconductor elements and forming external terminals by extending outside of a package and second leads interconnecting the semiconductor elements inside the package.

A circuit device according to some preferred embodiments includes a first semiconductor element and a second semiconductor element, first leads electrically connected to the first semiconductor element or the second semiconductor element via fine metal wires and having an end thereof extending outwardly, second leads electrically connected to both the first semiconductor element and the second semiconductor element via fine metal wires for electrically connecting the first semiconductor element and the second semiconductor element.

Furthermore, a circuit device preferably includes: first leads, second leads extending in the vicinity of one of the first leads and comprising a first prominent portion projecting upwardly, third leads extending in the vicinity of another one of the first leads and comprising a second prominent portion projecting upwardly and a chip element attached to the first prominent portion and to the second prominent portion via brazing material to jump over the first leads.

Furthermore, a circuit device preferably includes: a first circuit element, first leads electrically connected to the first circuit element via first fine metal wires and having one end thereof extending outwardly, second leads connected to the first leads via second fine metal wires and a second circuit element electrically connected to the second leads.

Furthermore, a circuit device preferably includes: an island, first leads having inner leads first leads having external leads formed by providing an end thereof in a periphery of the island via inner leads and projecting another end thereof from a sealing resin and a semiconductor element disposed on the island, further comprising wiring leads extending from one region on one side of a package formed of the sealing resin inside a package and from the inside of the package to another region on the one side of the package, wherein the semiconductor element is sealed inside the package and is electrically connected to a separate circuit element via the wiring leads.

A circuit device having a plurality of islands, first leads having external leads formed by providing an end thereof in a periphery of the plurality of islands via inner leads and projecting another end thereof from a sealing resin and a plurality of semiconductor elements disposed on the plurality of islands respectively, further comprising wiring leads extending from one region on one side of a package formed of the sealing resin to a vicinity of the plurality of islands and from the vicinity of the plurality of islands to another region on the one side of the package, wherein the plurality of semiconductor elements are sealed inside the package and are electrically interconnected via the wiring leads.

DETAILED DESCRIPTION OF THE INVENTION

The present invention relates to a technology implementing leads inside a package which function as wiring to achieve an SIP.

Typically, a lead frame has one or two islands, inner leads having one end thereof disposed in the vicinity of the island(s) and leads exposed outwardly from the package as exterior leads and functioning as electrodes. Semiconductor chips are respectively provided on each island and the leads are used to pass an input/output signal in electrodes of the respective semiconductor chips, thus interconnecting the semiconductor elements.

There are two types of packages which are an exception: the stacked multi-chip package comprising stacked semiconductor elements and the plain multi-chip package comprising a bridge between islands.

In the stacked-type package, the leads are provided for semiconductor elements interconnections, but they are used as external lead electrodes. On the other hand, in the plain-type package, a bridge is provided between islands for electrical interconnection. The bridge, which can be attached by an adhesive sheet, interconnects electrodes formed on side walls of mutually opposing semiconductor chips.

Figure 1:
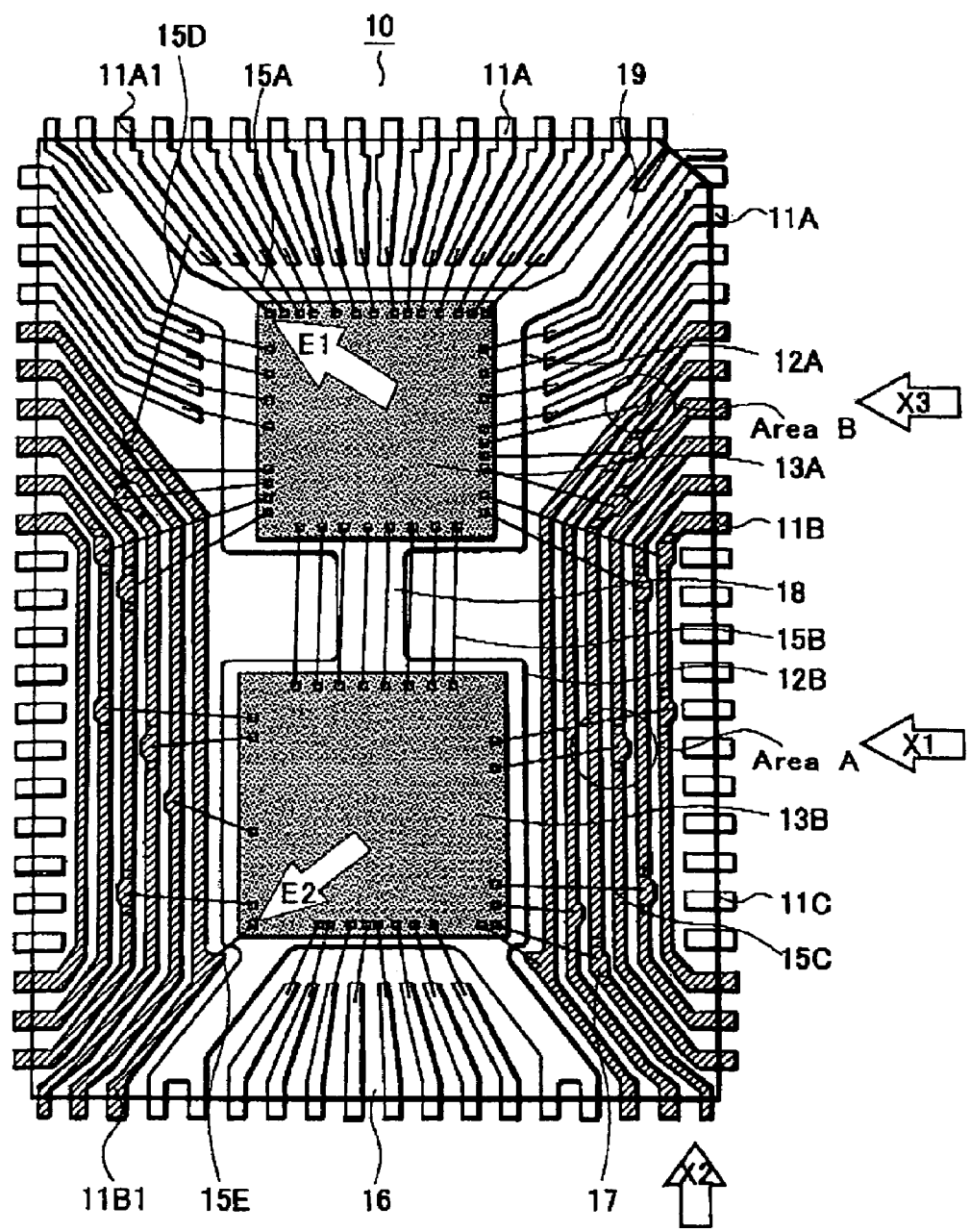
FIG. 1 is a plan view illustrating a circuit device according to some embodiments of the present invention.

In FIG. 1 of the present invention, second leads having the shape of key brackets are used as wiring. Leads are used in FIG. 1 to provide connections among a plurality of semiconductor elements, whereas in FIG. 4, they are used to provide connections among semiconductor elements and passive elements. These leads are not electrically connected to electrodes provided on a mounting board, so that they can be formed inside the package in the periphery of the island, irrespective of their shape.

Taking into consideration the drop of the second leads, the key brackets are positioned so that the second leads can be supported by the upper and lower mold. In case of using an adhesive tape, the shape does not have to be that of key brackets. With this invention, an inner lead refers to a part of a lead embedded in the package or in the sealing resin. A wiring lead refers to a lead that has the function of electrically interconnecting circuit elements. Leads as used in this invention include not only frame-like leads described in the following embodiments, but also conductive patterns, etc. formed on a mounting board.

A circuit device according to some preferred embodiments is described below with reference to FIG. 1 which is a plan view of a circuit device 10. The circuit device 10 comprises a first semiconductor element 13A and a second semiconductor element 13B, first leads 11A electrically connected to the first semiconductor element 13A or to the second semiconductor element 13B via fine metal wires 15A and having an end thereof exposed outwardly, second leads 11B electrically connected to both the first semiconductor element 13A and the second semiconductor element 13B via fine metal wires, thus providing electrical connections between the first and second semiconductor elements 13A and 13B. These elements are further described in more detail in what follows.

The first semiconductor element 13A can be an LSI (Large Scale Integration) chip secured to a first island 12A provided in the vicinity of the center of the circuit device 10 via an adhesive. Conductive materials such as solder or conductive paste or insulating materials made of resin can be used as adhesive, depending on the application.

The second semiconductor element 13B can be an LSI chip similar to the first semiconductor element 13A described above and is secured to a second island 12B connected to the first island 12A. The islands described above may be electrically separated.

The first island 12A and the second island 12B are formed by punching or etching a thin conductive foil. These two islands are linked by a connecting portion 18. Lifting leads 19 extend from upper right and left corners of the first island 12A disposed in an upper part of the paper to the upper right and left corners of the circuit device. Furthermore, lifting leads 19 also extend from lower right and left corners of the second island 12B disposed in a lower part of the paper to the lower right and left corners of the circuit device. These lifting leads 19 have a function of mechanically supporting the first island 12A and the second island 12B during the manufacturing process of the circuit device 10.

The first leads 11A have an end thereof connected to the first semiconductor element 13A or to the second semiconductor element 13B via fine metal wires 15A and another end thereof functioning as an exterior terminal for inputting/outputting electrical signals extends outside of a sealing resin 16 which seals this entirety.

The second leads 11B are electrically connected to the first semiconductor element 13A and further, with the second semiconductor element 13B via fine metal wires 15C. Accordingly, the first semiconductor element 13A and the second semiconductor element 13B are electrically connected via fine metal wires 15C and second leads 11B. In the paper, the first and second semiconductor elements 13A and 13B are aligned in a vertical direction in the vicinity of a central portion of the circuit device 10. A plurality of second leads 11B extend laterally in a vertical direction so as to clip the aligned first and second semiconductor devices 13A and 13B. Here, the second leads 11B are shown by the hatched area. Second leads 11B extend in the direction of alignment of the first and second semiconductor elements 13A and 13B so as to clip the first and second semiconductor elements 13A and 13B. Both ends of the second leads 11B extend outwardly from the sealing resin 16.

Third leads 11C do not provide any electrical connections between the other components inside the circuit device 10 and have an end thereof extending outwardly from the sealing resin 16. The third leads 11C have an end thereof extending at regular intervals to the periphery of the circuit device 10 to form terminals. A plurality of third leads 11C are provided in the area clipped by second leads 11B in the left and right corners of the circuit device 10 in the paper.

The sealing resin 16 covers and supports the first and second semiconductor elements 13A and respectively 13B, leads 11 and the fine metal wires 15. A configuration where a rear surface of leads 11 is exposed or where the sealing resin 16 covers the entirety including the rear surface of the leads 11 is also possible.

With this invention, leads 11B are employed to provide electrical connections among semiconductor elements. Here, electrodes formed on sides opposing the first and second semiconductor elements 13A, respectively 13B are directly electrically connected by fine metal wires 15B. However, it is difficult to electrically connect electrodes formed at locations other than opposing sides of the first and second semiconductor elements 13A and respectively 13B, using only fine metal wires 15. The use of the second leads 11B can help solve this issue. Electrodes formed on a lateral periphery of the first semiconductor element 13A are electrically connected to the second leads 11B via fine metal wires 15C. The second leads 11B extend vertically on the paper from the lateral periphery of the first semiconductor element 13A to the lateral periphery of the second semiconductor element 13B. The second semiconductor element 13B and the second leads 11B are electrically connected via fine metal wires 15C. Electrodes of the first semiconductor element 13A at locations other than the area adjacent the second semiconductor element 13B and electrodes of the second semiconductor element 13B at locations other than the area adjacent the first semiconductor element 13A are electrically connected via the second leads 11B.

Further wiring can be configured by connecting leads 11 via fine metal wires 15. Next, a configuration is described where electrode E1 of the first semiconductor element 13A and electrode E2 of the second semiconductor element 13B are electrically connected via fine metal wires 15 and leads 11. Here, electrode E1 is an electrode formed in the first semiconductor element 13A in a peripheral portion opposing an area adjacent the second semiconductor element 13B. Electrode E2 is a electrode formed in the second semiconductor element 13B in a peripheral portion opposing an area adjacent the first semiconductor element 13A. Electrode E1 is connected to a first lead 11A1 via a fine metal wire 15A and the first lead 11A1 is connected to a second lead 11B1 in the upper paper via a fine metal wire 15D. The second leads 11B1 extend vertically in the paper in a right lateral direction of the first and second semiconductor elements 13A and 13B. Then, the electrode E2 is electrically connected to the lower paper of the second lead 11B1 via a fine metal wire 15E.

Next, the electrical coupling structure in the vicinity of the first lead 11A1 is described. First lead 11A1 has an end thereof extending out of the sealing resin 16 forming the package outline to form an exterior terminal. Another end of the first lead 11A1 extends to the vicinity of the first semiconductor element 13A which functions as a circuit element and is electrically connected to the bonding pads of the first semiconductor element 13A via the fine metal wires 15A. The first lead 11A1 and the second lead 11B1 are electrically connected via a fine metal wire 15D. Here, the fine metal wires 15D rise above a plurality of leads and electrically connect leads of the same type. The use of such fine metal wire 15D enables provision of electrical connections among leads at random locations which renders possible the increase of the degree of freedom in wiring using leads. First lead 11A1 has an end thereof extending outwardly and functioning as an external terminal and, at the same time, by providing connections via fine metal wires 15D, they also function as a part of a wiring pattern embedded in the package.

In the circuit device 10 shown in FIG. 1, exterior terminals formed by one end of the first leads 11A, second leads 11B and third leads 11C extend outwardly from 4 peripheral portions of the sealing resin 16 at regular intervals. These exterior terminals are secured to the mounting board to thus enable mounting of the circuit device 10 and stabilization in mounting the circuit device 10.

Figure 2:
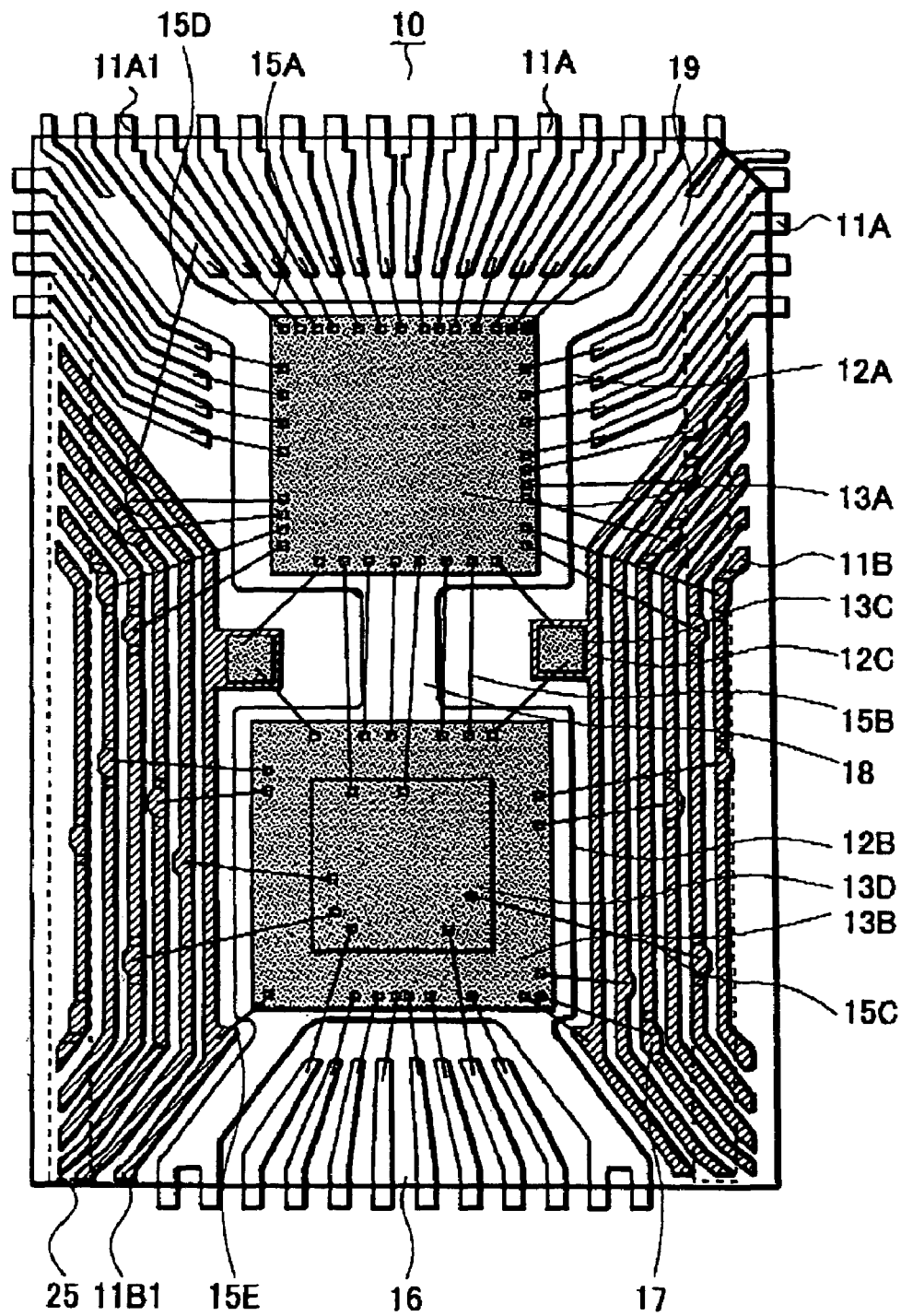
FIG. 2 is a plan view illustrating a circuit device according to some embodiments of the present invention.

Another embodiment of a circuit device 10 is next described with reference to FIG. 2. The fundamental configuration of the circuit device in FIG. 2 is similar to that of the circuit device described with reference to FIG. 1, accordingly, only differences thereinbetween are described in what follows.

The third semiconductor element 13C is preferably a bare transistor chip, etc. and is secured to a third island 12C disposed somewhere halfway the second leads 11B. The semiconductor element 13C is directly connected to either a first semiconductor element 13A or to a second semiconductor element 13B via fine metal wires 15. Here, the semiconductor element 13C may be electrically connected to the first or second leads 11A or respectively 11B via fine metal wires 15. Two third islands 12C extend from the second leads 11B so as to approach the connecting portion 18.

The fourth semiconductor element 13D is preferably an LSI chip, etc. and is secured to a surface of a second semiconductor element 13B. A stacked structure is thus obtained by a second semiconductor element 13B and a forth semiconductor element 13D secured to the second semiconductor element 13B. The fourth semiconductor element 13D is electrically connected to the first leads 11A and the second leads 11B, or with other circuit elements via fine metal wires 15.

The second leads 11B are embedded in the sealing resin that forms the package. The main role of the second leads 11B is to electrically connect circuit elements embedded in the package and therefore, they can be embedded in the package. With this configuration wherein third leads 11C have been omitted, a circuit device with a simplified structure can be achieved.

Support tape 25 has the role of supporting the second leads 11B. Since the second leads 11B are mechanically separated, a mechanism is needed to mechanically support each of these leads until the process of forming the sealing resin. Displacement of the second leads 11B can be prevented during the manufacturing process by securing the second leads 11B using an adhesion tape 25 which is applied to a surface or rear surface of the second leads 11B. Concretely, the support tape 25 has a function of securing the second leads 11B to the first leads 11A or to other leads. In the process of resin sealing, an adhesive sheet formed of resin, etc. may be attached to the rear surface of the leads to prevent the resin from wrapping around the rear surface of the leads.

Figure 3A:
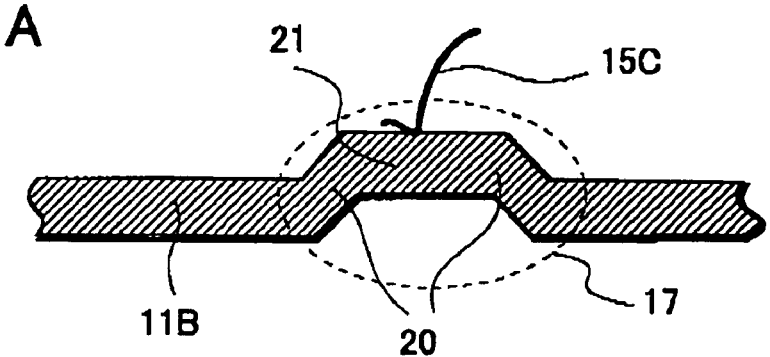
FIGS. 3A to D are cross-sectional views illustrating a circuit device according to some embodiments of the present invention.
Figure 3B:
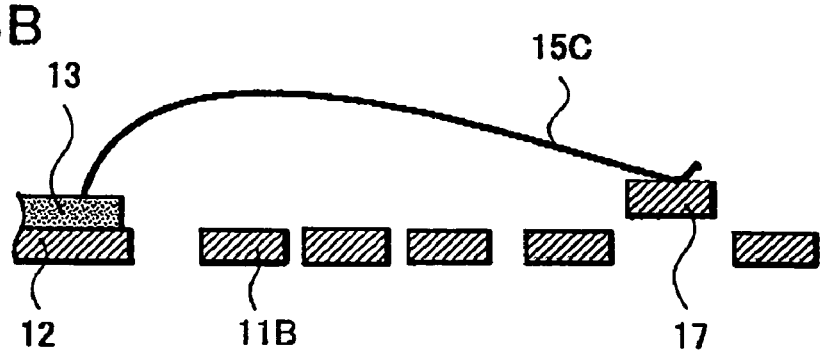

Next, a detailed description is given with reference to FIG. 3B of a prominent portion 17 provided on a second lead 11B at a location where fine metal wires 15C are formed. FIG. 3 is a view of a region A shown in FIG. 1, taken in an X1 direction. The prominent portion 17 is formed of an inclined portion 20 extending obliquely upward towards the second leads 11B extending in a horizontal direction and a planar portion 21 extending in a horizontal direction from the inclined portion 20. With this configuration, it is possible to place the planar portion 21 at a position above the other second leads 11B. The planar portion 21 which continues via the inclined portion 20 improves resistance of the prominent portion 17 and prevents dispersion of ultrasonic energy at the time of wire bonding. The prominent portion 17 can be provided on the second leads 11B or on the first leads 11A.

The coupling structure of the second leads 11B and semiconductor element 13 is next described with reference to FIG. 3B which is a view taken in the X2 direction of the region A shown in FIG. 1. Fine metal wires 15C jump over at least a lead 11 and are connected to the prominent portion 17 provided on the second leads 11B. This structure enables the heightening of the position of the entire fine metal wires 15C to thus increase the clearance between the fine metal wires 15C and the leads 11 (in particular, the second leads 11B located nearest to the prominent portion 17). Accordingly, even in case the fine metal wires 15C deform downwardly due to their own weight or to the pressure applied thereto during the resin sealing process, the second leads 11B and the fine metal wires 15C extending between the prominent portion 17 and the semiconductor element 13 are prevented from coming into contact.

Figure 3C:

In FIG. 3C, the second lead 11B abutting to the island 12 is connected to the semiconductor element 13 secured on the island 12 via fine metal wires 15C. The semiconductor element 13 and the second nearest lead 11 can be connected without providing a prominent portion 17 in the lead 11B at the location where fine metal wires 15 are connected. This represents the common wire-bonding process.

Figure 3D:
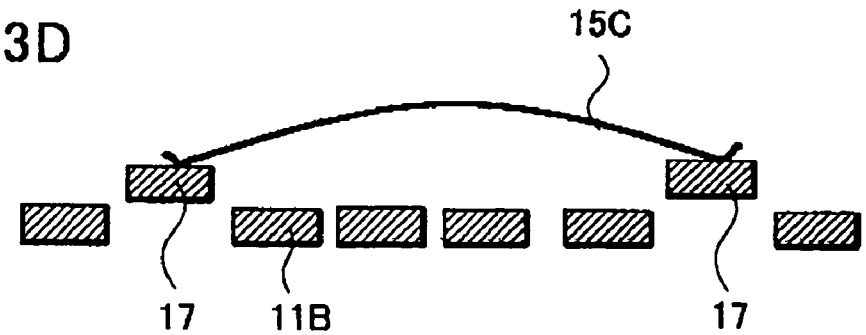

Prominent portions 17 provided halfway leads 11 are connected by fine metal wires 15C jumping over a plurality of leads 11, as shown in FIG. 3D. That means that one prominent portion 17 and the fine metal wire 15C are connected by ball bonding, whereas the other prominent portion 17 and the fine metal wire are connected by wedge bonding.

Figure 4A:
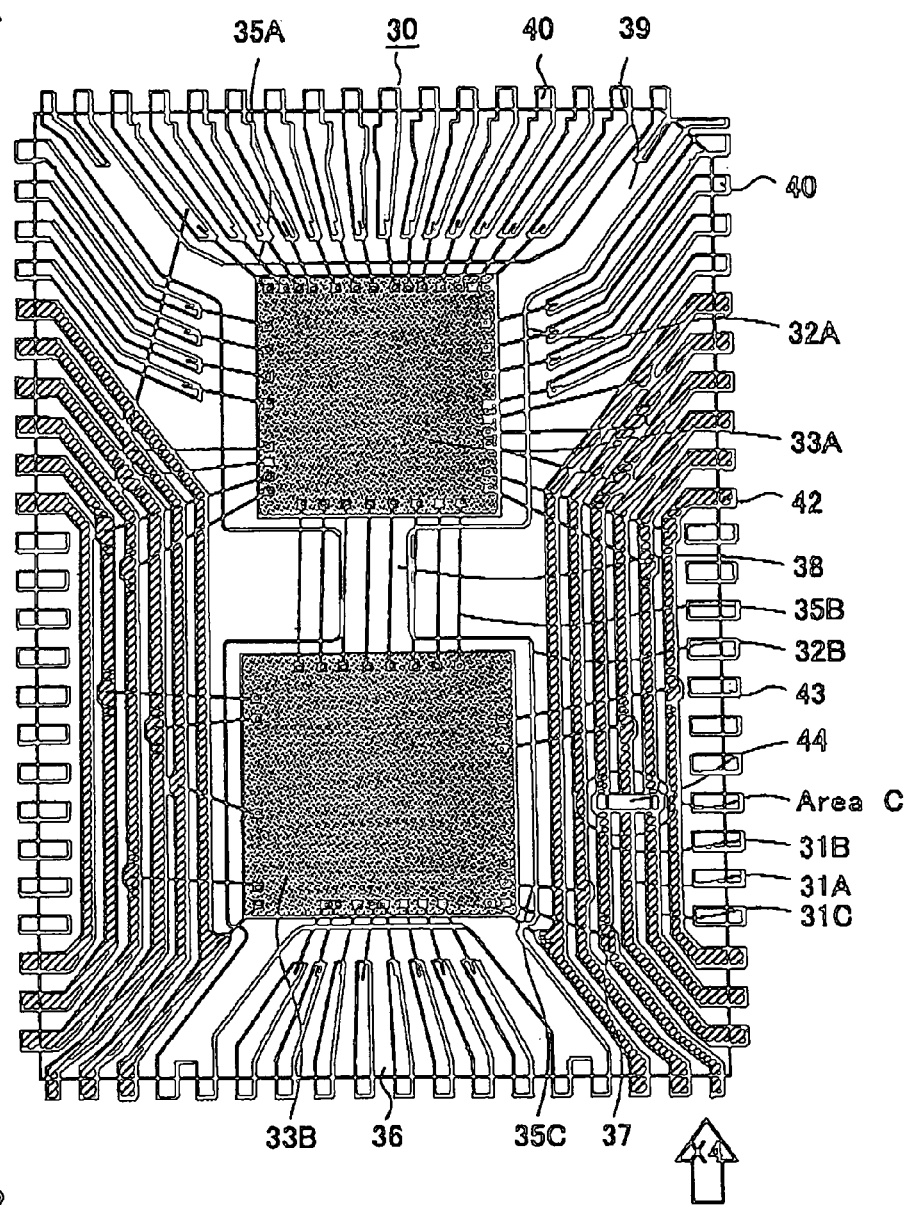
FIG. 4A is a plan view and FIG. 4B is a cross-sectional view illustrating a circuit device according to some embodiments of the present invention.
Figure 4B:
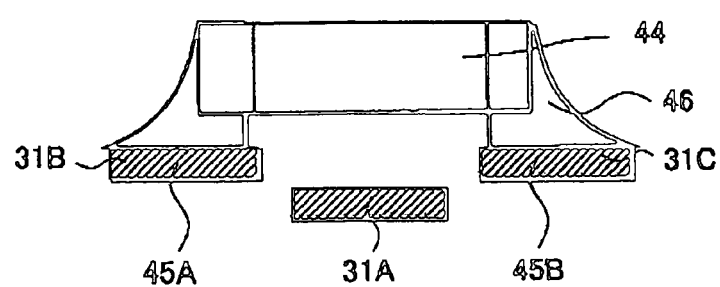
Figure 5A:
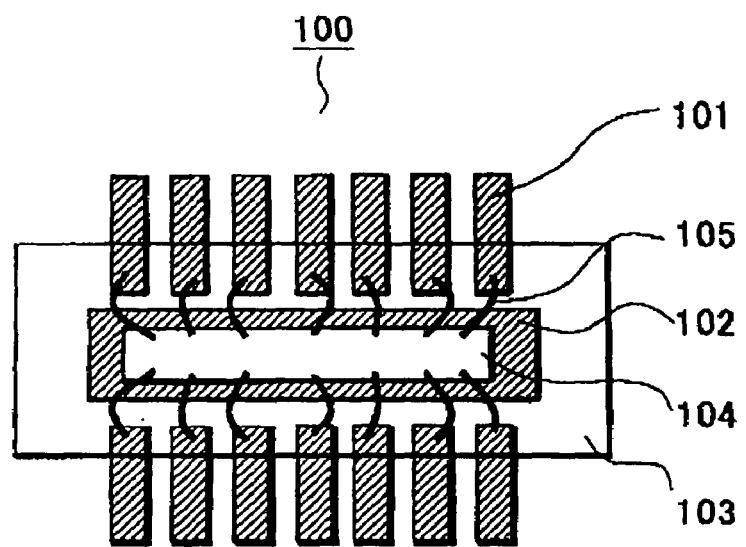
FIG. 5A is a plan view and FIG. 5B is a cross-sectional view illustrating a conventional circuit device.
Figure 5B:
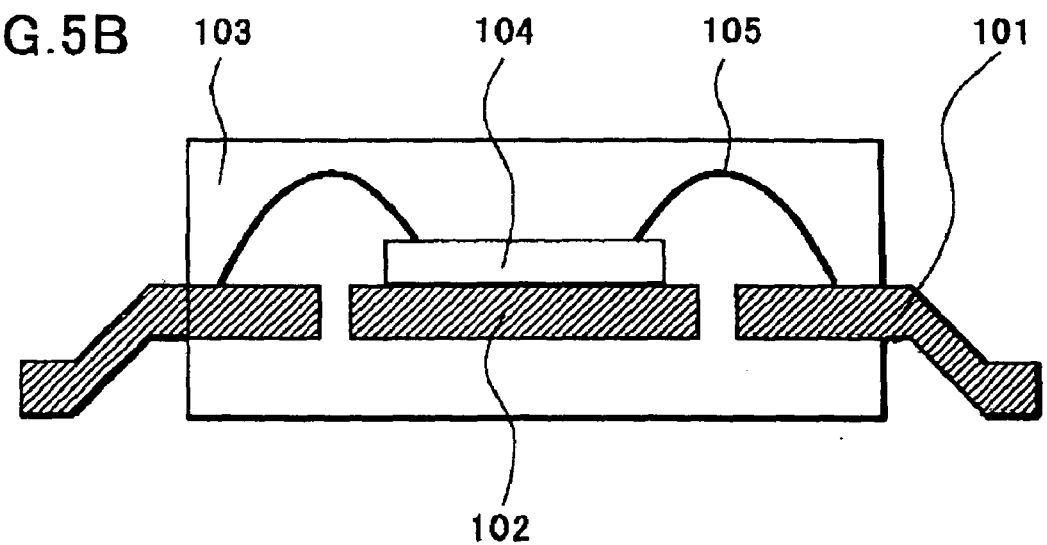

Another embodiment of a structure of a circuit device 30 is described with reference to FIG. 4. FIG. 4A is a plan view of the circuit device 30 and FIG. 4B is a cross-sectional view of a region C shown in FIG. 4A taken along the X4 direction. The fundamental structure of a circuit device 30 shown here is same as that of the device described with reference to FIG. 1 and the difference therebetween is in the coupling structure of a chip element 44.

Here, the circuit device 30 includes: first leads 31A, second leads 31B extending in the vicinity of one of the first leads 31A and comprising a first prominent portion 45A projecting upwardly, third leads 31C extending in the vicinity of other first leads 31A and comprising a second prominent portion 45B projecting upwardly and provided in the vicinity of the first prominent portion 45A, and a chip element 44 attached to the first prominent portion 45 and to the second prominent portion 45B via brazing material to jump over the first leads 31A. Here, the chip element 44 can be a chip resistor or a chip capacitor and can be electrically connected to the leads via brazing material 46, such as solder, etc.

Electrodes provided at both ends of the chip element 44 are connected to the leads 31 via brazing material 46 as shown in FIG. 4B. The chip element 44 is mounted so as to act as a bridge between the first prominent portion 45A of the second lead 31B and the second prominent portion 45B of the third lead 31C. Accordingly, by forming the prominent portion 45, the position of the chip element 44 becomes higher relative to the leads 31 thus enabling prevention of shorts between the other leads and the brazing material 46 used in connecting the chip element 44.

With reference to the same figure, the chip element 44 is connected to second and third leads 31B and respectively 31C so as to jump over the first leads 31A. This disposition of the chip element 44 allows for the adoption of chip elements which can be relatively large-scale chip capacitors, etc. The second and third leads 31B and 31C can be formed in accordance with the size of the chip element 44 and so as to jump over a plurality of first leads 31A. Compared to leads 31 at other locations, the width of the prominent portion 45 is large so that leaks of the brazing material 46 are prevented.

The above description concerns packages which have leads, but the described structure can be applied to other types of packages without limitation. Such other types of packages can include QFP (Quad Flat Package), QFN (Quad Flat Non-leaded Package), packages using an interposer of glass epoxy substrate, etc.

Second leads which extend in the alignment direction of a plurality of semiconductor elements and the fine metal wires provide electrical connections among semiconductor elements. It is thus possible to achieve a relatively complex wiring structure by employing leads. In case a design modification of the electrical circuit is required inside the circuit device, this modification can be implemented by modifying locations where fine metal wires are formed or by increasing/reducing the number of fine metal wires, without performing any modification to the lead pattern.

With this invention, fine metal wires connecting the semiconductor elements and the leads are also connected to a prominent portion projecting upwardly from the leads. It is therefore possible to place the entire fine metal wires at a position above the leads and even in case the fine metal wires are long, unnecessary contact between the fine metal wires and the leads can be prevented. It is also possible to secure the chip element to the prominent portion via brazing material. The structure described above prevents any shorts between the brazing material and the other leads.

What is claimed is:

1. A circuit device having:
    a plurality of semiconductor elements;
    first leads connected to bonding pads of the semiconductor elements and forming external terminals by extending outside of a package; and
    second leads electrically interconnecting the semiconductor elements inside the package,
    wherein both ends of the second leads are exposed outside of the package.

2. The circuit device of claim 1, wherein the second leads extend parallel with a direction of alignment of the plurality of semiconductor elements.

3. A circuit device having:
    a first semiconductor element and a second semiconductor element;
    first leads electrically connected to the first semiconductor element or to the second semiconductor element via fine metal wires and having an end thereof extending outwardly;
    second leads electrically connected to both the first semiconductor element and the second semiconductor element via fine metal wires for electrically connecting the first semiconductor element and the second semiconductor element,
    wherein both ends of the second leads are exposed outside of a package.

4. The circuit device of claim 3, wherein the fine metal wires are connected to the second leads so as to extend over an upper portion of at least one of the first leads or the second leads.

5. The circuit device of claim 3, wherein the second leads extend parallel with the direction of alignment of the first semiconductor element and second semiconductor element.

6. The circuit device of claim 3, wherein the second leads at locations where second leads are connected to the fine metal wires are formed to be wider than at other locations.

7. The circuit device of claim 3, wherein portions project upwardly from the second leads at locations where the second leads are connected to the fine metal wires.

8. The circuit device of claim 7, wherein each portion comprises an inclined portion extending obliquely upward from the second leads and a planar portion extending from the inclined portion.

9. A circuit device having:
    a first circuit element;
    first leads electrically connected to the first circuit element via first fine metal wires and having an end thereof extending outwardly;
    second leads connected to the first leads via second fine metal wires;
    a second circuit element electrically connected to the second leads,
    wherein both ends of the second leads are exposed outside of a package.

10. The circuit device of claim 9, wherein the first fine metal wires or the second fine metal wires extend over an upper portion of at least one of the first leads or second leads.

11. The circuit device of claim 9, wherein the first leads or the second leads at locations where the first fine metal wires or the second metal wires are connected are formed to be wider than at other locations.

12. The circuit device of claim 9, wherein prominent portions projecting upward are provided in the first leads or second leads at locations where the first fine metal wires or the second fine metal wires are connected.

13. The circuit device of claim 12, wherein each prominent portion includes an inclined portion extending obliquely upward from the second leads and a planar portion extending from the inclined portion.

14. A circuit device having an island, first leads having external leads formed by providing an end thereof in a periphery of the island via inner leads and projecting another end thereof from a sealing resin and a semiconductor element disposed on the island, comprising:
- wiring leads extending from one region on one side of a package formed of the sealing resin inside the package and from the inside of the package to another region on the one side of the package, wherein
- the semiconductor element is sealed inside the package and is electrically connected to a separate circuit element via the wiring leads,
- wherein both ends of the wiring leads are exposed outside of the package.

15. The circuit device of claim 14, wherein the separate circuit element is a semiconductor element or a passive element.

16. The circuit device of claim 14, wherein a plurality of semiconductor chips are stacked on the island.

17. A circuit device having a plurality of islands, first leads having external leads formed by providing an end thereof in a periphery of the plurality of islands via inner leads and projecting another end thereof from a sealing resin and a plurality of semiconductor elements disposed on the plurality of islands respectively, comprising
- wiring leads extending from one region on one side of a package formed of the sealing resin to a vicinity of the plurality of islands and from the vicinity of the plurality of islands to another region on the one side of the package, wherein
- the plurality of semiconductor elements are sealed inside the package and are electrically interconnected via the wiring leads,
- wherein both ends of the wiring leads are exposed outside of the package.

* * * * *